United States Patent [19]

Nicholls

[11] 4,380,816
[45] Apr. 19, 1983

[54] APPARATUS FOR RECYCLING COMPLETE CYCLES OF A STORED PERIODIC SIGNAL

[75] Inventor: Robin P. Nicholls, Santa Barbara, Calif.

[73] Assignee: Raytheon Company, Lexington, Mass.

[21] Appl. No.: 270,301

[22] Filed: Jun. 3, 1981

[51] Int. Cl.³ .......................... H04B 1/16; G11C 9/00
[52] U.S. Cl. ........................................ 375/94; 375/3; 377/129; 377/72; 328/151
[58] Field of Search .................. 328/37, 151; 377/129, 377/72; 375/3, 4, 94

[56] References Cited

U.S. PATENT DOCUMENTS

| | | | |
|---|---|---|---|
| 3,184,685 | 5/1965 | Funk et al. | 328/37 |
| 4,203,030 | 5/1980 | Moran | 328/37 |
| 4,223,404 | 9/1980 | Lowenschuss | 375/94 |
| 4,349,918 | 9/1982 | Gordon | 375/3 |

Primary Examiner—John S. Heyman
Attorney, Agent, or Firm—Richard M. Sharkansky; Joseph D. Pannone

[57] ABSTRACT

Apparatus for storing a periodic signal and for recycling complete cycles of such stored periodic signal. Samples of a periodic signal are stored in a memory at a time commencing at the start of a cycle of the periodic signal. A first control signal is produced at the start of each cycle of the periodic signal. A second control signal is produced when a predetermined portion of the storage means is full. In response to the second control signal and one of the first control signals produced after the second control signal, a signal is produced indicating the portion of the memory having samples of complete cycles of the periodic signal stored therein, such indicating signal being related to the amount of samples stored in the predetermined portion of the memory plus the amount of samples stored in such memory between the time of the second control signal and the time of the one of the first control signals produced after the second control signal. The samples in the portion of the memory having complete cycles stored therein as indicated by the indicating signal, are then recycled through the memory.

3 Claims, 11 Drawing Figures

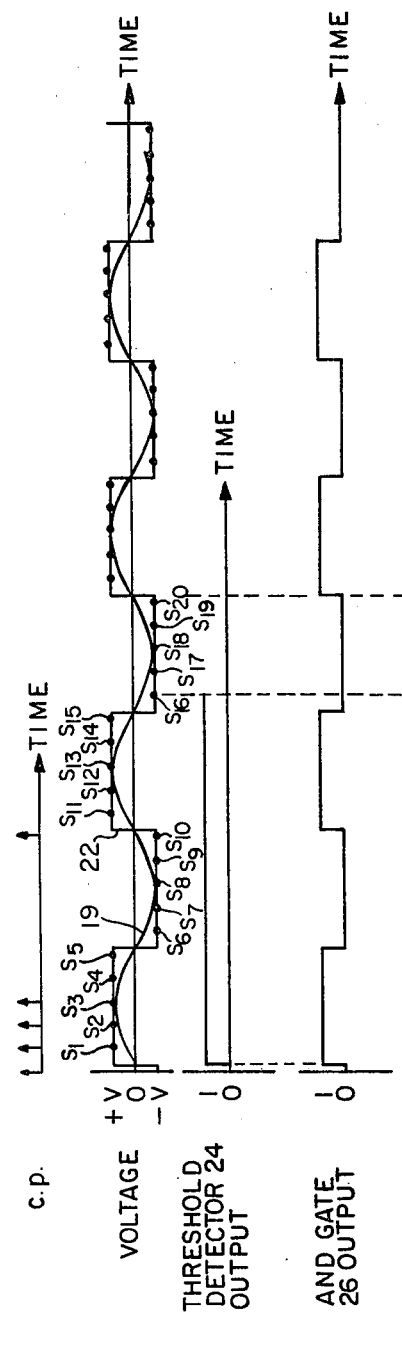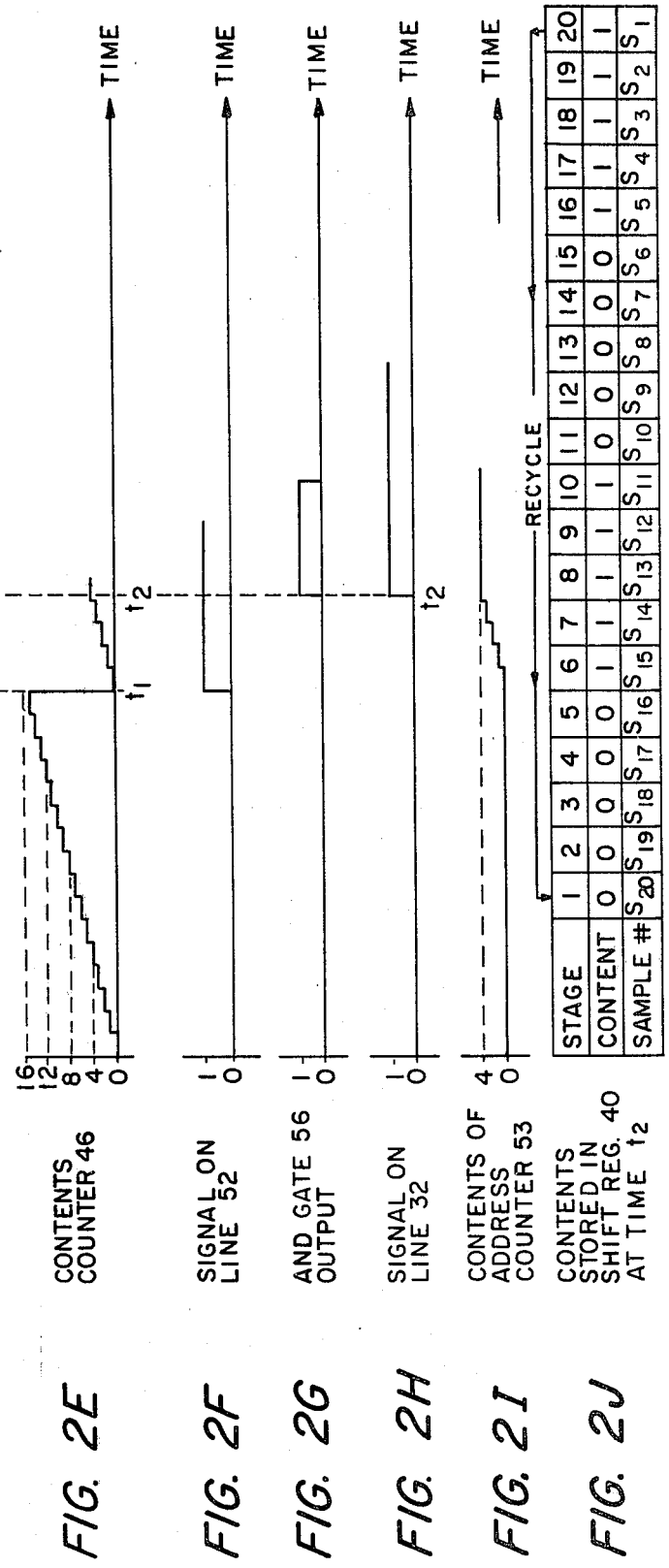

APPARATUS FOR RECYCLING COMPLETE CYCLES OF A STORED PERIODIC SIGNAL

BACKGROUND OF THE INVENTION

This invention relates generally to memory systems and more particularly to memory systems which are adapted to store a periodic signal and recycle complete cycles of such stored periodic signal.

As is known in the art, it is sometimes desirable to receive a pulse of radio frequency energy and produce a continuous wave signal having a frequency related to the frequency of the received energy. Such continuous wave signal may, for example, be transmitted as either a continuous wave signal or may be pulse modulated to enable transmission of a train of radio frequency signals. One technique suggested to produce such continuous wave signal has been to store the received signal in a recirculating memory; however, because the phase of the received signal at the start of the pulse relative to the phase of the signal at the end of the pulse is generally not known, because the frequency of the signal is not known, a phase discontinuity may be produced during the recycling. This phase discontinuity distorts the continuous wave signal being produced and thereby reduces the effectiveness of the system. In another technique this phase discontinuity problem is solved by producing control signals indicating the start of each cycle of the received signal. Such technique is described in U.S. Pat. No. 4,223,404 "Apparatus For Recycling Complete Cycles of A Stored Periodic Signal" issued Sept. 16, 1980 to Oscar Lowenschuss and assigned to the same assignee as the present invention. Such system stores a slice of, or the complete radio frequency pulse, and then recycles complete cycles of the stored signal. While such system is useful in many applications, in other applications it is desirable to recycle complete cycles of a received pulse prior to the termination of either an arbitrary pulse slice thereof or the received pulse itself.

SUMMARY OF THE INVENTION

In accordance with the present invention, apparatus for storing a periodic signal and for recycling complete cycle portions of such stored periodic signal is provided, such apparatus comprising: means for producing a first control signal indicating the start of each cycle of the periodic signal; storage means; means for commencing storage of the periodic signal in response to one of the first control signals; means for producing a second control signal indicating that a predetermined portion of the storage means has stored therein a first portion of the periodic signal; means responsive to both the second control signal and one of the first control signals produced subsequent to the production of the second control signal, for producing a signal indicating the portion of the memory means having stored therein complete cycles of the stored signal; and means, responsive to the indicating signal, for recycling complete cycles of the stored signal through the storage means. With such arrangement samples from complete cycles stored in the memory are recycled through such memory at a time when a new cycle of the periodic signal starts and immediately after the storage means has a predetermined number of samples stored therein.

BRIEF DESCRIPTION OF THE DRAWINGS

The foregoing features of this invention as well as the invention itself may be more fully understood from the following detailed description read together with the accompanying drawings in which:

FIGS. 2A-2J are diagrams useful in understanding the invention.

DESCRIPTION OF THE PREFERRED EMBODIMENT

Figure 1:
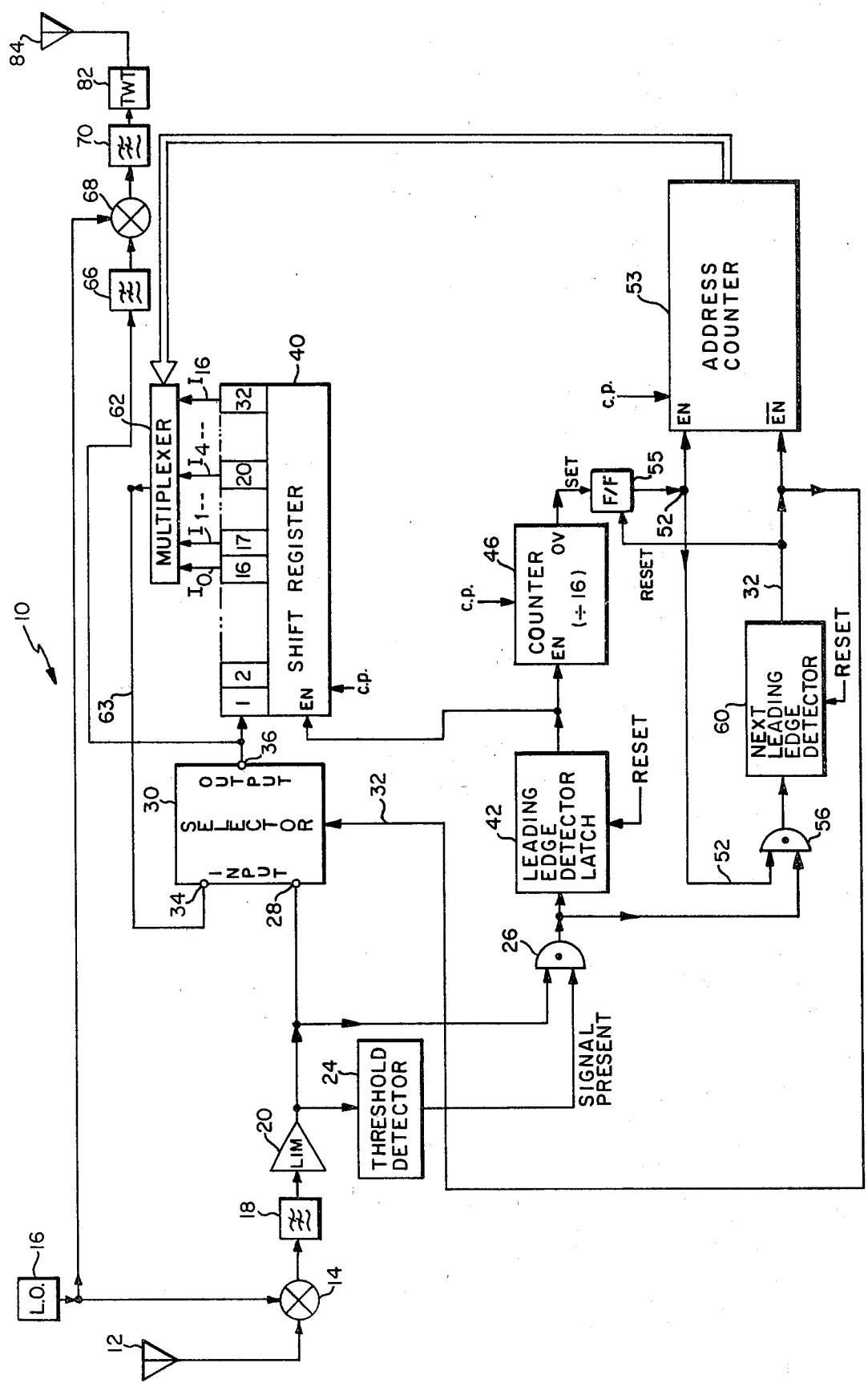
FIG. 1 is a block diagram of a memory system according to the invention.

Referring now to FIG. 1, a memory system 10 is adapted to receive pulses of radio frequency energy and transmit a continuous wave radio frequency signal having a frequency related to the frequency of the received radio frequency energy is shown. Such system 10 includes a conventional radio frequency antenna 12 coupled to a mixer 14 as shown. Also fed to such mixer 14 is a local oscillator signal produced by a conventional local oscillator 16. The mixer heterodynes the local oscillator signal with the received radio frequency signal to translate the frequency of the received signal to a suitable intermediate frequency signal. Here for example, the intermediate frequency is within the bandwidth 0 to 5 MHZ. A low pass filter 18 is coupled to the output of mixer 14 to reject harmonics having frequencies greater than 5 MHZ which are produced by the heterodyning process described. Thus, the output of the low pass filter 18 is an intermediate frequency signal having a frequency within the bandwidth 0 to 5 MHZ.

The output of filter 18 is shown in FIG. 2B as a sinusoidal signal 19. Such sinusoidal signal is fed to a limiter 20 which converts the sinusoidal signal to a train of pulses 22 (FIG. 2B) having a "high" or logical 1 state when the sinusoidal signal 19 is of positive polarity and a "low" or logical 0 state when the sinusoidal signal 19 has a negative polarity, as indicated. The train of pulses 22 produced by limiter 20 is fed to a threshold detector 24, an AND gate 26 and a first input terminal 28 of a selector 30, as shown. A control signal is fed to selector 30 via line 32. In response to the control signal on line 32 a selected one of a pair of input terminals 28, 34 is coupled to output terminal 36 of selector 30. Here the control signal on line 32 is initially a "low" or logical 0 signal (as shown in FIG. 2H) and hence initially the train of pulses fed to terminal 28 is fed through selector 30 to output terminal 36 and then to both the input of a shift register 40 and to a low pass filter 66. Shift register 40 is of any conventional design having a predetermined plurality of serially coupled storage stages. Here shift register 40 has 32 serially coupled storage stages, as indicated.

The threshold detector 24, in response to the detection of the received radio frequency signal, produces a "high" or logical 1 signal as shown in FIG. 2C. In response to logical 1 signals fed to AND gate 26 from the threshold detector 24 and the limiter 20 the output of AND gate 26 goes from a "low" state or (logical 0 state) to a "high" state or (logical 1 state) as shown in FIG. 2D. This transition is detected by a leading edge detector latch 42, here a conventional "D" flip/flop, and in response to such transition the output of leading edge detector latch 42 changes from an initially logical 0 state to a logical 1 state enabling shift register 40 to respond to clock pulses fed thereto on line CP and enabling counter 46 to count clock pulses fed to it on line CP, as indicated. It is here noted that the clock pulses are produced at a regular rate, here at a rate slightly greater than 10 MHZ as shown in FIG. 2A. In response to each clock pulse a sample of the signal fed to selector 30 is taken and such sample signal is stored in stage 1 of the shift register 40 with previous samples in such register 40 being shifted sequentially through the other stages of the shift register 40 in a conventional manner in response to each one of the clock pulses in a conventional manner. Further, each clock pulse is counted by counter 46. Here counter 46 serves as a divider to produce a signal at its overflow output (OV) after a predetermined number of samples of the signal have been stored in the shift register 40. In particular, the output of counter 46 produces a signal when the shift register 40 has stored samples in a predetermined portion of its storage stages, here in half (i.e. 16) of its 32 stages. (It is noted that at least one complete cycle must be stored in the predetermined portion of the storage stages). That is, when 16 samples have been stored in the shift register 40, counter 46 has also counted 16 clock pulses, and an overflow signal is produced by counter 46. To put it another way, counter 46 is a divide by 16 circuit (i.e. four bit counter) and in counting the 16th clock pulse (indicated that 16 samples have been stored in shift register 40), its contents overflows and the output at its overflow terminal OV changes from a logical 0 signal to a logical 1 signal. The OV output of counter 46 is fed to the set input of a flip/flop 55 to produce a high signal on line 52 and enable terminal (EN) of address counter 53. Such signal is also fed to an AND gate 56. The signal on line 52 is shown in FIG. 2F. Also fed to AND gate 52 is the output of AND gate 26. The output of AND gate 56 is fed to a "Next Leading Edge Detector" 60, here also a "D" flip/flop. The output of detector 60 is fed to selector 30 via line 32 and to the reset terminal of flip/flop 55.

In operation then, and referring now to the FIGS. 2A–2F, in response to the first leading edge of a detected signal, the output of AND gate 26 produces a logical 1 signal as shown in FIG. 2D and samples $S_1$, $S_2$, $S_3$, ... of such signal are stored in successively coupled storage stages of the shift register 40 as shown in FIG. 2J and each sample that is stored is counted by counter 46 as shown in FIG. 2E. When the 16th sample, $S_{16}$, is stored stage 1 of shift register 40 (i.e. at time $t_1$) the contents of 4 bit counter 46 overflows producing logical 1 signal at overflow terminal OV. This condition is detected by flip/flop 55 changing line 52 from a logical 0 state to a logical 1 state as shown in FIG. 2F. The signal on line 52, along with the signal at the output of AND gate 26 (FIG. 2D) are fed to AND gate 56, as shown. The logical signal on line 52 also starts or enables counter 53 to start counting clock pulses fed thereto on line CP. It is noted from FIG. 2D that the output of AND gate 26 changes from a logical 0 state to a logical 1 state each time the polarity of the received signal 19 goes from a negative polarity to a positive polarity thereby indicating the start of each cycle of the received signal. It is also noted that the output of AND gate 56 (FIG. 2G) goes from a logical 0 state to a logical 1 state when AND gate 26 only when: (1) shift register 40 has stored 16 samples, as indicated by line 52 being logical 1; and (2) a new cycle of the received signal has occurred, as indicated by the output of AND gate 26 going to a logical 1 from a logical 0 state. It follows then that when the output of AND gate 56 changes from a logical 0 state to a logical 1 state (FIG. 2G) this indicates the first time a new cycle of the received signal has started after the shift register 40 has become half full (i.e. after 16 samples (i.e. $S_1$–$S_{16}$) have been stored in stages 16 to 1, respectively thereof). The transition in the output of AND gate 56 changing from a logical 0 to a logical 1 state is detected by leading edge detector 60. In particular, in response to the signal at the output of AND gate 56 changing from a logical 0 state to a logical 1 state the signal at the output of leading edge detector 60 (on line 32) goes from a logical 0 state to a logical 1 state (at time $t_2$) as shown in FIG. 2H. The logical 1 signal on line 32 stops the clock pulse counting of counter 53 by resetting flip/flop 55. The contents of counter 53 therefore now equals the number of samples stored in the shift register from the time the shift register 40 has half full until the time of the start of the next complete cycle of the received signal (i.e. the number of samples stored in shift register 40 in the time interval between time $t_1$ and $t_2$). This is shown in FIG. 2I, for the example illustrated where four samples (i.e. $S_{17}$, $S_{18}$ $S_{19}$ and $S_{20}$) were stored during the period of time between the times $t_2$ and $t_1$. The contents of address counter 53 [i.e. here the count of $(4)_{10}$] is fed to a multiplexer 62 (FIG. 1). Multiplexer 62 has 32 inputs coupled to the outputs of stages 16 to 32 of shift register 40. These inputs are here on lines $I_0$–$I_{16}$, respectively. In response to the contents of counter 52 one of the lines $I_0$–$I_{16}$ is coupled to the output line 63 of multiplexer 62. More particularly, the contents of $(0)_{10}$, $(1)_{10}$ ... $(16)_{10}$ of counter 53 couple lines $I_0$ ... $I_{16}$, respectively to such output 36. In the example illustrated in FIGS. 2A to 2J, therefore the contents of counter 53 is $(4)_{10}$ and therefore line $I_4$ is coupled to output line 63 of multiplexer 62. It follows then that storage stage 20 of shift register 40 is coupled to line 63. Further the "high" signal on line 32 (FIG. 2H) couples the input terminal 34 (i.e. line 63) to the output 36 of selector 30 and hence to the input of the shift register 40. It follows then that in response to succeeding clock pulses on line CP samples in the first twenty stages of shift register 40 recycle through such shift register 40 (FIG. 2J). The output of selector 30 (FIG. 1) is also fed to the low pass filter 66 (FIG. 1) to filter harmonics of the binary signals passing thereto from selector 30. The fundamental frequency of such binary signals will be the frequency of the intermediate frequency signal passing through low pass filter 18. The output of low pass filter 66 is fed to a mixer 68 where it is heterodyned with a local oscillator signal produced by the local oscillator 16 to upconvert the frequency of such signal to a continuous wave signal having the frequency of the received radio frequency signal. The output of the mixer 68, after passing through a low pass filter 70 to remove higher order harmonics, is amplified in a conventional radio frequency amplifier, here a traveling wave tube (TWT) amplifier 82 and transmitted via antenna 84. After a desired number of cycles of the continuous wave signal have been transmitted the recycling of such shift register 40 is stopped by resetting next edge detector 60 by any conventional means as by an operator.

Having described the preferred embodiment of this invention, it is evident that other embodiments incorporating these concepts may be used. It is felt, therefore, that this invention should not be restricted to the discloseed embodiment, but rather should be limited only by the spirit and scope of the appended claims.

What is claimed is:

1. Apparatus for storing a periodic signal and for recycling complete cycle portions of such stored periodic signal comprising:

means for producing first control signals indicating the start of each cycle of the periodic signal;

storage means;

means for commencing storage of the periodic signal in response to one of the first control signals;

means for producing a second control signal indicating that a predetermined portion of the storage means has stored therein a first portion of the periodic signal;

means responsive to both the second control signal and one of the first control signals produced subsequent to the production of the second control signal, for producing a signal indicating the portion of the memory means having stored therein complete cycles of the stored signal; and means, responsive to the indicating signal, for recycling complete cycles of the stored signal through the storage means.

2. The apparatus recited in claim 1 wherein the first control signal producing means includes means for detecting each time the periodic signal passes through a predetermined level in a predetermined sense.

3. The apparatus recited in claim 2 wherein the storage means includes a shift register.

* * * * *